United States Patent
Kobayashi

(10) Patent No.: US 6,509,956 B2
(45) Date of Patent: Jan. 21, 2003

(54) PROJECTION EXPOSURE METHOD, MANUFACTURING METHOD FOR DEVICE USING SAME, AND PROJECTION EXPOSURE APPARATUS

(75) Inventor: Mitsuru Kobayashi, Kawasaki (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/852,325

(22) Filed: May 10, 2001

(65) Prior Publication Data

US 2002/0008862 A1 Jan. 24, 2002

(30) Foreign Application Priority Data

May 12, 2000 (JP) .......................... 2000-140979
May 9, 2001 (JP) .......................... 2001-138832

(51) Int. Cl.$^7$ .................... G03B 27/52; G03B 27/42; G03B 27/54; G03B 27/32; G03F 9/00
(52) U.S. Cl. .................... 355/55; 355/53; 355/67; 355/75; 355/77; 430/5; 430/311; 430/312
(58) Field of Search .................... 355/53, 55, 67, 355/75, 77; 430/5, 311, 312

(56) References Cited

U.S. PATENT DOCUMENTS 4,660,966 A * 4/1987 Kato et al.
4,888,614 A * 12/1989 Suzuki et al.
5,117,255 A    5/1992 Shiraishi et al.
5,448,333 A    9/1995 Iwamoto et al.

FOREIGN PATENT DOCUMENTS

JP    A 11-135420    5/1999

* cited by examiner

*Primary Examiner*—Russell Adams
*Assistant Examiner*—Khaled Brown
(74) *Attorney, Agent, or Firm*—Oliff & Berridge, PLC

(57) ABSTRACT

A projection exposure apparatus is provided which prevents a deterioration in alignment accuracy even if a deviation of the optical axis occurs with projection magnification adjustment of a projection optical system.

After the projection magnification of a projection optical system is adjusted based on measurement results of marks formed on a substrate mounted on a substrate stage, the substrate is exposed by a predetermined pattern via the projection optical system. Information related to an imaging position of the projection optical system is measured after adjustment of the projection magnification and before exposure of the substrate.

19 Claims, 8 Drawing Sheets

PROJECTION EXPOSURE METHOD, MANUFACTURING METHOD FOR DEVICE USING SAME, AND PROJECTION EXPOSURE APPARATUS

FIELD OF THE INVENTION

The present invention relates to a projection exposure method and a projection exposure apparatus for projecting and exposing a predetermined pattern onto a substrate mounted on a substrate stage via a projection optical system. More specifically, the present invention relates to a projection exposure method and a projection exposure apparatus, which measures a mark formed by exposure in a plurality of shot areas on the substrate, to thereby obtain position information of each shot area by statistical processing.

This application is based on Japanese Patent Application No. 2000-140979, the contents of which are incorporated herein by reference.

BACKGROUND ART

Heretofore, projection exposure apparatus have been used when manufacturing semiconductor devices or liquid crystal display devices by a photolithography process, which projects a pattern image of a photo mask or a reticle (hereinafter generally referred to as a "reticle") onto each shot area on a photosensitive substrate via a projection optical system. Recently, as such kind of projection exposure apparatus, a so-called step and repeat type exposure apparatus, for example, a reduction projection type exposure apparatus (stepper) has been used in many cases. In this apparatus, a photosensitive substrate is mounted on a two-dimensionally movable stage and the substrate is moved step by step by this stage, to thereby repeat an operation for sequentially exposing a pattern image of the reticle onto each shot area on the photosensitive substrate.

For example, micro devices such as semiconductor devices are formed by overlapping a circuit pattern having multiple layers, on a wafer coated with a photosensitive material, as a photosensitive substrate. Hence, at the time of projection exposure of the circuit pattern in the second or further layers onto the wafer, it is necessary to perform positioning of each shot area on the wafer having a circuit pattern already formed thereon, with a pattern image of a reticle to be exposed next, that is, to perform accurate positioning (alignment) between the wafer and the reticle.

For example, with respect to one wafer having a shot area, on which a circuit pattern is to be exposed, arranged thereon in a matrix, as a method for aligning the wafer at the time of performing overlap exposure, so-called enhanced global alignment (EGA) disclosed in, for example, Japanese Unexamined Patent Application, First Publication No. Sho 61-44429 has become predominant.

The EGA method is a positioning method as described below. That is, at least three areas (hereinafter referred to as "EGA shot") of a plurality of shot areas formed on the wafer are specified, and the coordinate position of the alignment mark (mark) annexed to each shot area is measured with, for example, an off-axis alignment system. Thereafter, error parameters (offset, scale, rotation and perpendicularity) related to the array characteristics (position information) of the shot area on the wafer are determined based on the measurement and design values, by statistical operation involving the method of least squares. Based on the determined parameter values, the coordinate value for the design is then corrected with respect to all the shot areas on the wafer, and the wafer stage is moved step by step, using a baseline quantity, being a distance between the projection optical system and the off-axis alignment system, in accordance with this corrected coordinate value. As a result, the projected image of the reticle pattern and the plurality of shot areas on the wafer are precisely overlapped and exposed at a working point (a reference point at which the coordinate value is measured or calculated, for example the center of the shot area) set in the shot area.

However, the above described conventional projection exposure method and projection exposure apparatus have problems described below.

In the case where the wafer scaling (scaling of the whole wafer) and shot scaling (scaling for each shot area) of the above error parameters are calculated with the EGA measurement, the shot size on the wafer and the shot size at the time of exposure are controlled so as to coincide with each other, by driving optical lenses in the projection optical system to adjust the projection magnification (hereinafter referred to as "lens magnification drive"), as shown in a flowchart in FIG. 9. In this case, however, it is found that by performing lens magnification drive, mechanical deviation occurs between lenses in the projection optical system, thereby slightly shifting the optical axis of the projection optical system.

Since positioning of the wafer has been heretofore performed based on the results of EGA performed before the deviation occurs, without taking this deviation of the optical axis into consideration, the pattern image is exposed in a state of being shifted, causing a problem in that the relative position of each shot area formed on the wafer in which the circuit pattern has been already formed and the pattern image of the reticle to be exposed next is shifted, that is, the overlapping accuracy decreases.

In order to avoid this problem, there has been adopted a method in which evaluation exposure is performed beforehand under predetermined conditions, and the error parameters obtained by the above described EGA measurement are corrected using the evaluation results. However, due reasons such as, hysteresis exists in the lens magnification drive, or conditions at the time of evaluation, such as atmospheric pressure or the like are different at the time of actual exposure, the deviation of the optical axis which actually occurs does not always coincide with the evaluation result, thus leaving a problem in that deterioration of the overlapping accuracy cannot be solved.

The present invention has been completed in view of the above situation, with an object of providing a projection exposure method and a projection exposure apparatus which can prevent deterioration of the overlapping accuracy, even if the optical axis is shifted with the adjustment of the projection magnification of the projection optical system.

BRIEF SUMMARY OF THE INVENTION

In order to achieve the above object, the present invention adopts the following constructions corresponding to FIG. 1 to FIG. 7 showing embodiments of the present invention.

The projection exposure method of the present invention is characterized in that in a projection exposure method in which after imaging characteristics of a projection optical system (9) are adjusted based on measurement results of marks (YEM, XEM) formed on a substrate (W) mounted on a substrate stage (10), the substrate (W) is exposed by a predetermined pattern via the projection optical system (9), information related to an imaging position of the projection optical system (9) is determined after adjustment of the imaging characteristics and before the exposure of the substrate (W).

In this projection exposure method, since the information related to the imaging position of the projection optical system is determined after adjustment of the imaging characteristics and before exposure of the substrate, positioning error of the substrate attributable to the deviation of the optical axis can be eliminated. As a result, it becomes possible to expose the pattern on the substrate with predetermined accuracy, and hence deterioration in the overlapping accuracy can be prevented beforehand.

If the deviation of the optical axis is measured during the actual exposure processing step, the evaluation result does not differ from the actual exposure, as in the case where the evaluation exposure is performed separately. As a result, there is the effect that the image shift quantity can be obtained accurately and quickly.

In an other embodiment, the projection exposure method is a procedure wherein the imaging characteristics include projection magnification of the projection optical system, and by measuring information related to the imaging position of the projection optical system after adjustment of the imaging characteristics and before exposure of the substrate, information related to the imaging position of the projection optical system is obtained.

In an other embodiment, the projection exposure method is a procedure wherein information related to the imaging position is measured by measuring position information of a mark on the substrate stage via the projection optical system.

As a result, with this projection exposure method, an effect can be obtained where the deviation amount of the optical axis can be detected more accurately.

In an other embodiment, the projection exposure method is a procedure wherein position information of either a reference mark set on the substrate stage or a mark on the substrate mounted on the substrate stage is measured via the projection optical system.

As a result, with this projection exposure method, an effect can be obtained where the deviation amount of the optical axis can be detected accurately, using either the reference mark or the mark on the substrate.

The projection exposure method according to a fifth aspect is a procedure for measuring the position information of the mark on the substrate stage via a mask having the predetermined pattern formed thereon.

As a result, with this projection exposure method, an effect can be obtained where the deviation amount of the optical axis, designating the mask as a reference, can be detected, thereby improving the alignment accuracy with respect to the mask.

In an other embodiment, the projection exposure method is a procedure wherein information related to the imaging position is measured by measuring a relative position of a mask mark on the mask and a mark on the substrate stage.

As a result, with this projection exposure method, an effect can be obtained where the deviation amount of the optical axis, designating the mask as a reference, can be detected with the mask mark and the mark on the substrate stage.

In an other embodiment, the projection exposure method is a procedure wherein adjustment of projection magnification is performed based on the measurement result obtained by measuring the position information of the mark on the substrate with predetermined measurement accuracy.

As a result, with this projection exposure method, an effect can be obtained where measurement can be executed in a state closer to the actual exposure light, at the time of measuring the mark on the substrate.

In an other embodiment, the projection exposure method is a procedure wherein position information of a plurality of shot areas on the substrate is calculated, based on the measurement results of the plurality of marks with higher measurement accuracy than the predetermined measurement accuracy.

As a result, with this projection exposure method, an effect can be obtained where error parameters can be obtained by performing measurement in a state closer to the actual exposure light, thereby enabling improvement in the overlapping accuracy. Another effect can be obtained where even if an error occurs in the projection magnification adjustment, this can be quickly detected at the time of measurement with higher measurement accuracy than predetermined measurement accuracy, thereby enabling prevention of poor exposure beforehand.

In an other embodiment, the projection exposure method is a procedure wherein readjustment of the projection magnification is performed, based on the measurement results of the plurality of marks with higher measurement accuracy than the predetermined measurement accuracy, and the calculated position information of a plurality of shot areas on the substrate is corrected, based on the information related to the imaging position respectively measured before and after the readjustment.

As a result, with this projection exposure method, an effect can be obtained where even if deviation of the optical axis occurs with the readjustment of the projection magnification, the error parameters can be reliably corrected, thereby maintaining the overlapping accuracy.

In an other embodiment, the projection exposure method is a procedure wherein it is determined whether measurement of information related to the imaging position is to be performed or not, depending on the readjustment amount of the calculated projection magnification.

As a result, with this projection exposure method, unnecessary sequences are not performed, thereby enabling improvement in the throughput in the exposure processing.

In an other embodiment, the projection exposure method is a procedure wherein position information of a plurality of shot areas on the substrate and the adjusted amount of the projection magnification are calculated, by performing statistical processing using the results of measurement of position information of a plurality of marks, and the calculated position information of the plurality of shot areas on the substrate is corrected based on the information related to the imaging position respectively measured before and after the adjustment of the projection magnification.

As a result, with this projection exposure method, positioning error of the substrate attributable to the deviation of the optical axis can be eliminated, and hence a pattern can be exposed with predetermined accuracy on a shot area on the substrate, thereby enabling prevention beforehand of deterioration in overlapping accuracy. Since the deviation of the optical axis is measured during the actual exposure processing step, the evaluation result does not differ from the actual exposure, as in the case where the evaluation exposure is performed separately. Hence, there is the effect that the image shift quantity can be obtained accurately and quickly.

In an other embodiment, the projection exposure method is a procedure wherein it is judged whether measurement of information related to the imaging position is to be performed or not, depending on the adjusted volume of the projection magnification calculated by the statistical processing.

As a result, with this projection exposure method, unnecessary sequences are not performed, thereby enabling improvement in the throughput in the exposure processing.

In an other embodiment, the projection exposure method is a procedure wherein the position information of a plurality of marks is measured with or without the projection optical system.

As a result, with this projection exposure method, even if marks on the substrate are measured using either an alignment sensor of the TTR (or TTL) type or the off-axis type, there can be obtained an effect where positioning error of the substrate attributable to the deviation of the optical axis can be eliminated.

Moreover, the present invention provides a device manufacturing method involving a step for transferring a device pattern formed on a mask onto a substrate, using the projection exposure method according to either of the above described methods.

A projection exposure apparatus of the present invention is a projection exposure apparatus (1) for projection-exposing a predetermined pattern formed on a mask (R) onto a substrate (W) mounted on a substrate stage (10) via a projection optical system (9), comprising: a measurement device (16, 17) which measures position information of a plurality of marks (YEM, XEM) formed on the substrate (W); an adjustment device (22) which adjusts the imaging characteristic of the projection optical system (9) based on the results of measurement by the measurement device (16, 17), and a detection device (19) which obtains information related to a change of the imaging position of the projection optical system (9) attributable to adjustment of the imaging characteristic by the adjustment device (22).

Therefore, according to the projection exposure method and the projection exposure apparatus of the present invention, by adjusting the imaging characteristics of the projection optical system (9), based on the error parameters calculated by the EGA measurement, being the measurement results for the marks (YEM, SEM), even if a deviation of the optical axis occurs, the above described error parameters can be recorrected, using the information related to the change of the imaging position of the projection optical system (9) after adjustment of the imaging characteristics. Therefore, the error parameters include the deviation of the optical axis resulting from adjustment of the imaging characteristics. Hence, a predetermined pattern can be exposed on the substrate (W) with predetermined positioning accuracy being maintained.

As a result, with this projection exposure apparatus, positioning error of the substrate attributable to the deviation of the optical axis can be eliminated. Hence, it becomes possible to expose a pattern on the substrate with predetermined accuracy, and deterioration in the overlapping accuracy can be prevented beforehand.

If the deviation of the optical axis is measured during the actual exposure processing step, the evaluation result does not differ from the actual exposure, as in the case where the evaluation exposure is performed separately. As a result, there is the effect that the image shift quantity can be obtained accurately and quickly.

In an other embodiment, the projection exposure apparatus has a construction where the imaging characteristics include projection magnification of the projection optical system, and the detection device respectively detects the information related to the imaging position of the projection optical system before and after adjustment by the adjustment device.

In an other embodiment, the projection exposure apparatus has a construction where the detection device measures the position information of a reference mark placed on the stage, or a mark on the substrate, via the projection optical system.

As a result, with this projection exposure apparatus, an effect can be obtained where the deviation amount of the optical axis can be detected more accurately, by using either of the reference mark or the mark on the substrate.

In an other embodiment, the projection exposure apparatus has a construction where the calculation device performs statistical processing using the results of measurement results by the measurement device, and calculates the position information of a plurality of shot areas on the substrate and the adjusted amount by the adjustment device, and the correction device corrects the position information of the plurality of shot areas on the substrate calculated by the calculation device, based on information related to the imaging position detected by the detection device.

As a result, with this projection exposure apparatus, error parameters can be obtained by performing measurement in a state closer to the actual exposure light, thereby enabling improvement in the overlapping accuracy. There is also obtained an effect where even if an error occurs in the projection magnification adjustment, this can be quickly detected at the time of measurement with higher measurement accuracy than predetermined measurement accuracy, thereby enabling prevention of poor exposure beforehand.

In an other embodiment, the projection exposure apparatus has a construction where the measurement device measures the position information of the marks by either one of a first measuring method for measuring the position information via the projection optical system, and a second measuring method for measuring the position information without using the projection optical system.

As a result, with this projection exposure apparatus, even if marks on the substrate are measured using either alignment sensor of the TTR (or TTL) type or the off-axis type, there can be obtained an effect that positioning error of the substrate attributable to the deviation of the optical axis can be eliminated.

DETAILED DESCRIPTION OF THE INVENTION

A first embodiment of the projection exposure method and the projection exposure apparatus of the present invention will now be described, with reference to FIG. 1 to FIG. 4. Here, for example, description is given using an example of a case where at the time of exposing a circuit pattern on a reticle, respectively, on a plurality of shot areas on a wafer for manufacturing semiconductor devices, position information of each shot area on the wafer is calculated.

Figure 1:
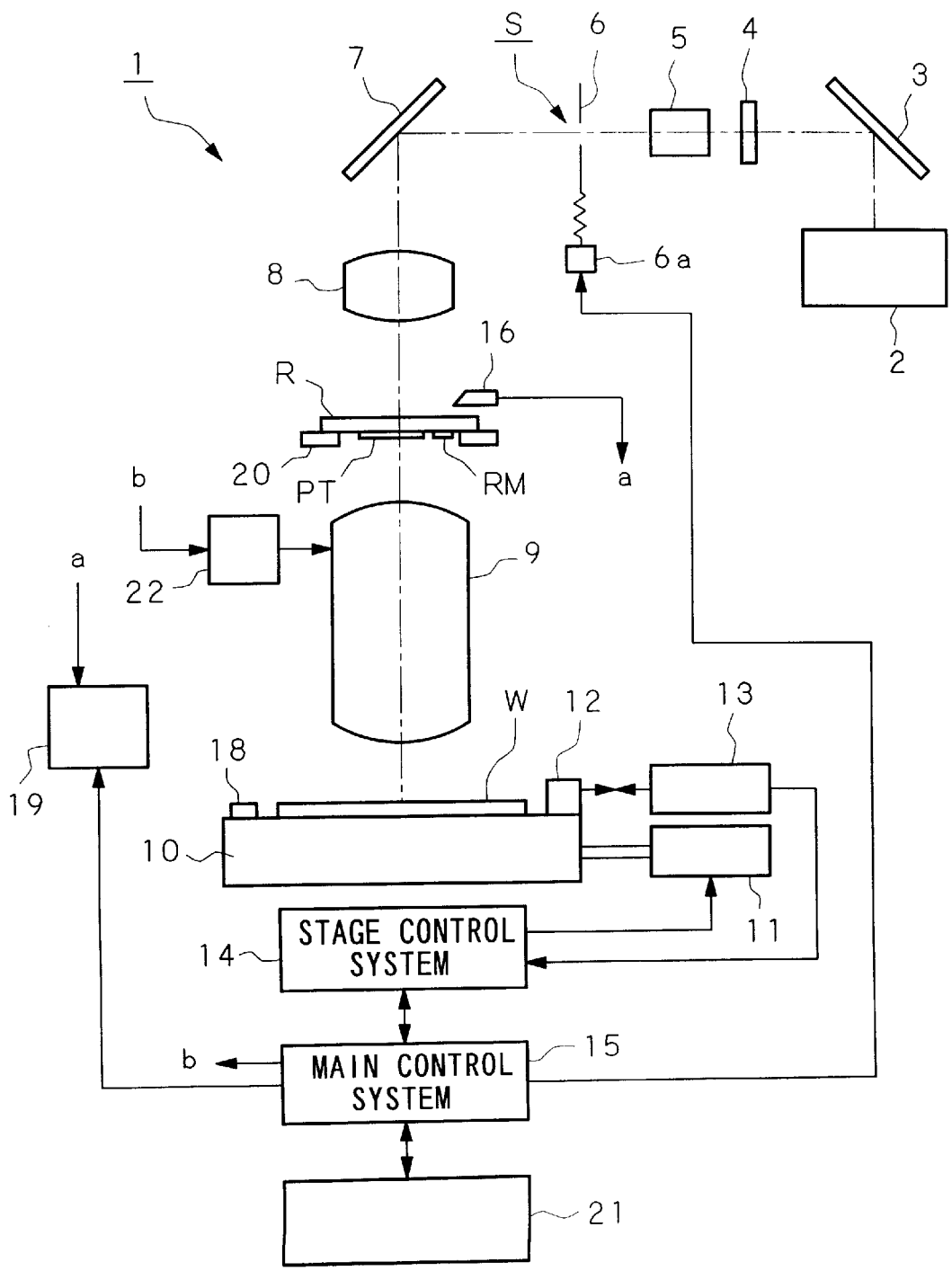
FIG. 1 is a diagram showing a first embodiment of the present invention, being a schematic block diagram of a projection exposure apparatus.

FIG. 1 is a block diagram of an exposure apparatus (projection exposure apparatus) 1. Illumination light emitted from a light source 2 such as an extra-high pressure mercury lamp or an excimer laser is reflected by a reflecting mirror 3, and shone into a wavelength selection filter 4, which transmits only light having the necessary wavelength for exposure. The illumination light transmitted through the wavelength selection filter 4 is adjusted to a luminous flux having a uniform intensity distribution by an optical integrator (fly eye lens or rod) 5, and reaches a reticle blind (field stop) 6. The reticle blind 6 is for setting the illumination area on a reticle (mask) R due to the illumination light, by respectively driving a plurality of blades regulating an aperture S is respectively driven with a drive system 6a to thereby change the size of the aperture S.

The illumination light having passed through the aperture S of the reticle blind 6 is reflected by a reflecting mirror 7 and enters into a lens system 8. By means of this lens system 8, an image of the aperture S of the reticle blind 6 is formed on the reticle R held on a reticle stage 20, and a desired area on the reticle R is illuminated. In FIG. 1, these wavelength selection filter 4, optical integrator 5, reticle blind 6 and lens system 8 constitute the illumination optical system. The reticle stage 20 can be moved two-dimensionally within a plane perpendicular to the optical axis of the projection optical system 9, and the position and the rotation of the reticle stage 20 (and the reticle R) are detected by a laser interferometer (not shown). The measurement value of this laser interferometer is respectively output to a stage control system 14, a main control system (calculation device and correction device) 15, and an alignment control system (detection device) 19 described later.

The image of a circuit pattern (predetermined pattern) PT and/or an alignment mark (mask mark) RM, which is present in the illumination area of the reticle R, is formed on a wafer (substrate) W applied with a resist, by the projection optical system 9. As a result, the image of the pattern PT and/or the image of alignment mark RM of the reticle is exposed on a specific area (shot area) on the wafer W mounted on the wafer stage (substrate stage) 10.

The projection optical system 9 is for projecting the image of the pattern PT and/or the image of the alignment mark RM onto the wafer W, for example, at a reduction magnification of ¼, by a plurality of lens elements arranged in a lens-barrel with a predetermined spacing along the optical axis and formed in a group. These lens elements are moved in the direction of the optical axis by driving extendible/retractable drive elements severally arranged in the circumferential direction, thereby enabling adjustment of various imaging characteristics of the projection optical system 9. For example, in the case where the lens elements are moved in the direction of the optical axis, the magnification can be changed about the optical axis. In the case where the lens elements are inclined about an axis orthogonal to the optical axis, distortion can be changed. Moreover, not by moving the lens elements, but by controlling the atmospheric pressure in a sealed space provided between the lens elements, the imaging characteristics of the projection optical system can be adjusted. As another method for an adjustment (control) technique for imaging characteristics of the projection optical system 9, a method of changing and controlling the wavelength (central wavelength) of the illumination light emitted from the light source 2 (so-called wavelength shift) may be adopted. By this wavelength shift, for example, projection magnification can be changed. By combining the above described various imaging characteristics adjustment techniques, various imaging characteristics may be adjusted, or one specific imaging characteristic (for example, projection magnification) may be adjusted by combining the above described plurality of adjustment techniques (for example, in the case where the projection magnification cannot be adjusted only by the wavelength shift technique, the adjustment amount that cannot be adjusted may be adjusted by moving the lens elements in the direction of the optical axis). The imaging characteristics of these projection optical systems 9 are controlled by an imaging characteristics adjusting system (adjustment device) 22 integratedly controlled by the above main control system 15.

The wafer stage 10 has a wafer holder (not shown) for vacuum-attaching the wafer W, and is moved in the X direction and Y direction which are perpendicular to the optical axis of the projection optical system 9 and are orthogonal to each other, by a drive 11 such as a linear motor. As a result, the wafer W is two-dimensionally moved on the image surface side with respect to the projection optical system, to thereby transfer a pattern image of the reticle R to each shot area on the wafer W, for example, by the step and repeat method (or the step and scan method).

Moreover, the position of the wafer stage 10 (and the wafer W) in the X and Y directions on the stage movement coordinate system (orthogonal coordinate system) XY, and the rotation (yawing amount, pitching amount and rolling amount) are detected by a laser interferometer 13 for emitting a laser beam onto a mobile mirror (reflecting mirror) 12 provided at an end portion of the wafer stage 10. The measurement value (position information) of the laser interferometer 13 is respectively output to a stage control system 14, a main control system 15 and an alignment control system 19.

The stage control section 14 respectively controls the movement of the reticle stage 20 and the wafer stage 10 via a drive 11, based on the position information from the main control system 15 and the laser interferometer 12. The main control system 15 controls the size and the shape of the aperture S of the reticle blind 6 via a drive system 6a, performs EGA calculation based on the position information of the alignment mark on the wafer W output from the alignment control system 19, and calculates the projection magnification of the projection optical system 9 based on the error parameters calculated by the EGA calculation. A memory 21 for storing exposure data (recipe) such as array position of the shot area and exposure sequence, is attached to the main control system 15, and the main control system 15 performs integrated control of the whole apparatus based on this exposure data.

This projection exposure apparatus 1 is provided with an alignment sensor (measurement device) 16 of the TTR (through the reticle) method (a first measurement method), in order to perform positioning of the reticle R and the wafer W.

The reticle alignment sensor 16 detects the alignment mark RM formed on the reticle R, for example, using illumination light for exposure, and a reference mark on a reference mark member 18 or an alignment mark described later formed on the wafer (mark on the substrate) WM (see FIG. 3) via the projection optical system 9. In the exposure light alignment method, displaying the alignment mark on the reticle R and the reference mark on the monitor, using an imager (CCD), enables direct observation of the position. The reference mark member 18 is fixed on the wafer stage 10, and the reference mark is formed at the same height as the surface of the wafer W.

The reticle alignment sensor 16 outputs an imaging signal obtained by taking pictures of the alignment mark RM of the reticle R and the reference mark or the alignment mark WM at the same time, to the alignment control system 19. The alignment control system 19 detects a misalignment amount of both marks based on the imaging signal, and also inputs a measurement value of the laser interferometer 13 or the like for respectively detecting the position of the reticle stage 20 and the wafer stage 10, to thereby determine respective positions of the reticle stage 20 and the wafer stage 10 at which the misalignment amount of both marks becomes a predetermined value, for example, zero. As a result, the position of the reticle R on the wafer stage movement coordinate system XY is detected. In other words, the reticle stage movement coordinate system is associated with the wafer stage movement coordinate system XY (that is, the relative position is detected), and the alignment control system 19 outputs the result (position information) to the main control system 15. The alignment sensor 16 may use any of a single wavelength laser beam (He-Ne laser, etc.), a multi-wavelength beam, a broadband beam, or an exposure light as the illumination light for alignment (however, if other than the exposure light is used as the alignment illumination light, it is necessary to arrange a known compensation optical element for compensating for chromatic aberration occurring in the projection lens, between the reticle and the projection optical system, or in the vicinity of the pupil plane of the projection optical system). Alternatively, an imager or a SPD may be used as a photodetector.

The alignment control system 19 detects the misalignment amount of both marks based on the imaging signal from the reticle alignment sensor 16, and also inputs the measurement value of the laser interferometer 13, to thereby determine the position of the wafer stage 10 at which the misalignment amount of both marks becomes a predetermined value, for example, zero, as the coordinate value of the alignment mark on the wafer stage movement coordinate system XY, and outputs the position information to the main control system 15. The main control system 15 gives an instruction related to the signal processing conditions to the alignment control system 19, and performs the EGA calculation based on the position information (coordinate value) of the alignment mark output from the alignment control system 19, that is, calculates the position information (coordinate value) of each shot area (reference point, for example, shot center) on the wafer W. Moreover, the main control system 15 corrects the coordinate value calculated by the alignment control system 19, and outputs this corrected coordinate value to the stage control system 14. The stage control system 14 controls the movement of the wafer stage 10 via the drive 11, based a on the position information from the main control system 15. As a result, a pattern image of the reticle R is transferred to each shot area on the wafer W by, for example, the step and repeat method (or the step and scan method).

The wafer W in this embodiment will now be described.

Figure 2:
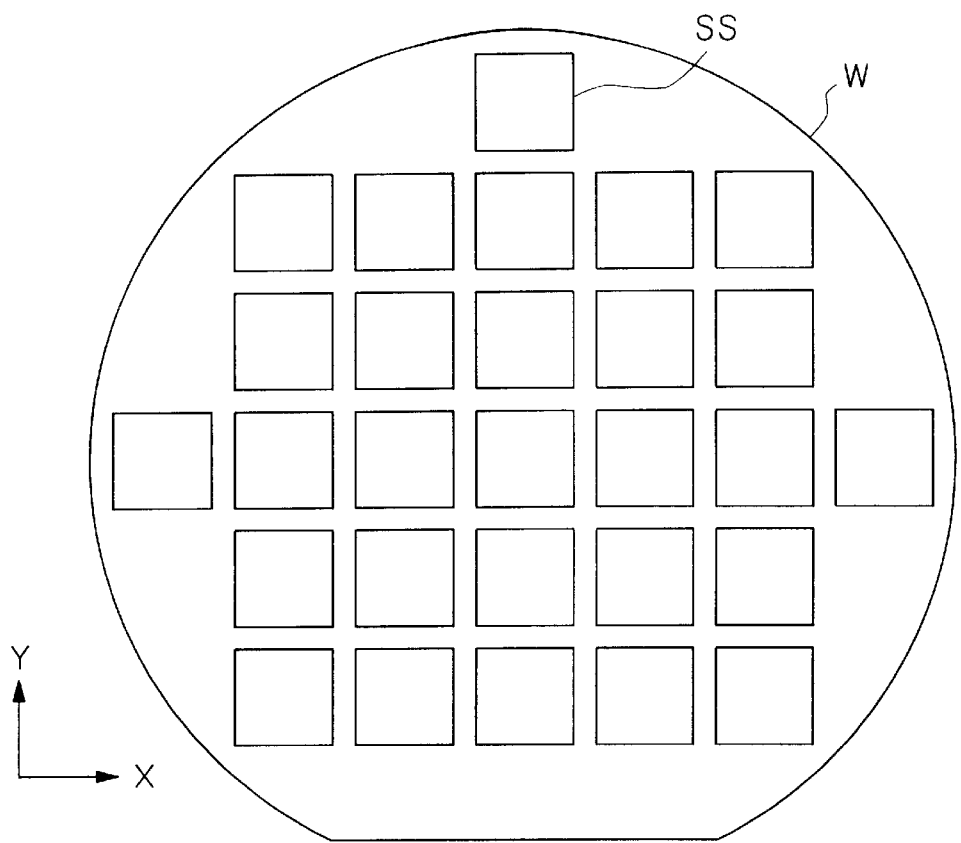
FIG. 2 is a plan view of a wafer having a plurality of shots.
Figure 3:
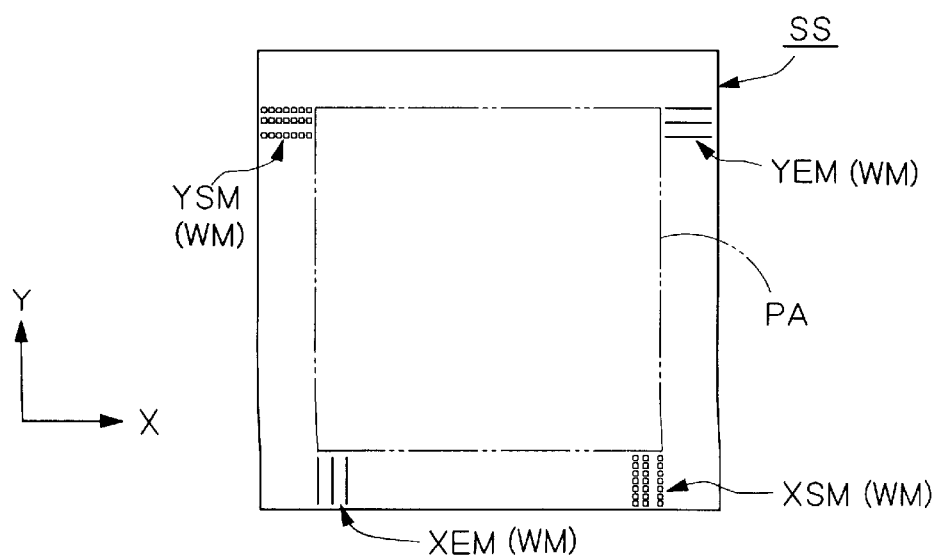
FIG. 3 is an enlarged diagram of each shot area.

As shown in FIG. 2, on the wafer W, there are arranged a plurality of (28 in the figure) shot areas SS in the form of a matrix, and a chip pattern is formed respectively on each shot area SS by the exposure processing, and development processing or the like in a previous step. As shown in FIG. 3, in each shot area, there are formed a Y search mark YSM for the Y direction and an X search mark XSM for the X direction, respectively used for search alignment. Moreover, a Y mark (mark) YEM for the Y direction and an X mark (mark) XEM for the X direction used for EGA measurement, being fine alignment, are formed respectively for each area. The alignment marks WM are constituted of these marks YSM, XSM, YEM and XEM. In this embodiment, the search marks YSM, XSM are formed in each shot area, but it is not always necessary to form these marks in all the shot areas, and they need only be formed in at least two shot areas.

The search marks YSM, XSM are one-dimensional marks, in which a plurality of (three in FIG. 3) line patterns comprising a plurality of dots are arranged in parallel with a space to each other in the Y direction and in the X direction. The distance between the line patterns in each search mark is set to be asymmetric, so as to be discriminated from a circuit pattern or the like. These search marks YSM, XSM can be applied to either case where the wafer alignment sensor 17 is a luminous interference type alignment system or a laser step alignment type alignment system.

As the search marks XSM, YSM, for example, a straight bar pattern may be used, instead of the line patterns comprising a plurality of dots. Further, the mark construction for two-dimensional detection may be obtained by combining the search marks XSM, YSM into one. In FIG. 2, the number of marks of the search marks XSM, YSM is made three, but this may be any number, so long as it is at least one. Instead of making the mark interval different in the search marks XSM, YSM, the mark interval may be made uniform, and the pattern length in the longitudinal direction (in the direction orthogonal to the array direction) may be made partially different.

The Y mark YEM and the X mark XEM are formed of a line and space pattern, being a one-dimensional mark in which lines extending respectively in the X direction and the Y direction are arranged in parallel with an equidistant space in the X direction and the Y direction. The search marks YSM, XSM are formed with a longer length compared to the length of the Y mark YEM and the X mark XEM, so that these can be detected even if the prealignment accuracy of the wafer W is rough.

Subsequently, an operation of performing a second exposure by the projection exposure apparatus 1 having the above construction with respect to the wafer W having a circuit pattern and alignment marks formed thereon will be described, using a flowchart shown in FIG. 3. Here, it is assumed that the size and the step pitch (shot interval) of the shot area, the position of the shot area for performing the search alignment in which measurement is performed with predetermined accuracy and the shot area for performing the EGA measurement in which measurement is performed with higher accuracy than in the search alignment (hereinafter appropriately referred to as "EGA shot"), the position of the search mark and the alignment mark, the measurement sequence and the like are input and edited beforehand. Here, it is also assumed that six areas are set as the EGA shot, for all the shot areas on the wafer W. This EGA shot is not limited to six, so long as there are three or more. This EGA shot need not necessarily always coincide with the shot area for performing the search alignment.

At first, the reticle R is aligned by measuring the alignment mark RM on the reticle R and the reference mark on the reference mark member 18 using the alignment sensor 16.

Then, alignment is performed with respect the wafer W loaded on the wafer stage 10. Here, the wafer W loaded on the wafer stage 10 is mounted thereon, with the wafer W being pre-aligned, but positioning is not performed to the level at which the EGA measurement can be executed as fine alignment. Therefore, before executing the EGA measurement, so-called search alignment is normally performed for roughly adjusting the wafer W before performing the EGA measurement, so as not to hinder the EGA measurement. This search alignment is for measuring the search alignment mark in the shot area specified beforehand (for example, in two places, hereinafter referred to as "search shot"), to thereby correct the coordinate value of the shot area based on this measurement result.

Therefore, when a wafer having completed the previous step is loaded on the wafer stage 10, with the wafer being pre-aligned, search alignment is performed in accordance with the set measurement sequence. Specifically, the stage control system 14 drives the wafer stage 10 via the drive 11, to thereby sequentially move the Y search mark YSM, and the X search mark XSM in the search shot SS to the detection position of the alignment sensor 16. The position of the wafer W is monitored highly accurately by the laser interferometer 13 via the wafer stage 10, and the stage control system 14 can perform positioning of the position of the wafer W highly accurately, based on this monitoring result.

When the search mark is set to the detection position, and after focus adjustment of alignment sensor 16. Based on the obtained measurement result, the positions of the Y mark YEM and the X mark XEM in the shot area set on the wafer, in which the EGA measurement is performed, are corrected.

That is to say, the main control system 15 corrects the coordinate value for the design of the X mark XEM and the Y mark YEM on the wafer stage movement coordinate system XY for each EGA shot, based on the coordinate value of the measured X search mark XSM and Y search mark YSM on the wafer stage movement coordinate system XY and the corresponding coordinate value for the design. The stage control system 14 moves the wafer stage 10 based on the measurement value of the laser interferometer 13, designating this corrected coordinate value as a target value, to position the X mark XEM and the Y mark YEM within the detection area of the alignment sensor 16, respectively, for each EGA shot.

When the search alignment is completed, the EGA measurement is performed (step S1). That is to say, the Y mark YEM in the EGA shot is moved to the detection position of the alignment sensor 16. At this time, since the position information of the Y mark YEM and the X mark XEM is corrected by the above search alignment, the Y mark YEM can be moved to the position where the alignment sensor 16 can detect the mark without any problem. After performing the focus adjustment, the position of the Y mark YEM is measured by the alignment sensor 16. Then, the wafer W is moved to measure the position of the X mark XEM. Thereafter, the positions of the Y mark YEM and the X mark XEM are sequentially measured in accordance with the set measurement sequence, in a similar procedure to as described above, while moving the wafer W.

When the measurement in step S1 is performed using the exposure light, this is performed with a quantity of light which does not expose a resist applied on the wafer. However, it is a matter of course that the quantity of light exceeds the necessary minimum quantity of light for detecting the alignment mark.

When the position measurement of the Y mark YEM and the X mark XEM in the EGA shot is completed, six error parameters of X shift, Y shift, X scale, Y scale, rotation and perpendicularity are calculated as the position information related to the array characteristic of the shot area on the wafer W, by statistical operation processing such as the method of least squares, based on the obtained measurement value and the design value. Based on these error parameters, the coordinate position for the design is corrected with respect to all the shot areas on the wafer W. The obtained X scale and Y scale are also averaged, to calculate the shot magnification drive amount (shot magnification) (step S2).

Instead of calculating the aforementioned six error parameters, the operation may be such that, as disclosed in Japanese Unexamined Patent Application, First Publication Sho 61-44429, a coefficient (element) of a model function (for example, determinant) representing the array characteristic of the shot area, including these six error parameters is calculated by statistical operation processing, and the coordinate value for the design is substituted for the model function in which this coefficient is calculated for each shot area, to thereby calculate the coordinate value on the wafer stage movement coordinate system XY. When it is necessary to determine at least one of the aforementioned six error parameters, the at least one error parameter can be determined using the coefficient calculated above.

Thereafter, the first image shift measurement of the projection optical system 9 is performed (step S3), before adjusting the imaging characteristics of the projection optical system 9 (for example, lens magnification (projection magnification)). Specifically, the wafer stage 10 is first moved, to thereby move the reference mark on the reference mark member 18 sequentially to the detection position of the alignment sensor 16. Then, this reference mark and the alignment mark RM on the reticle R are measured at the same time by the alignment sensor 16, and the misalignment amount of both marks is detected and stored as a measurement value 1.

Subsequently, the imaging characteristics of the projection optical system 9 including the lens magnification drive based on the shot magnification drive amount calculated in the above step S2 are adjusted by the imaging characteristics adjusting system 22, using the above-described various adjustment techniques (lens element drive, atmospheric pressure control in the sealed space, wavelength shift, and the like), based on the error parameters (step S4). In this imaging characteristics adjustment, particularly, with the lens magnification drive, an image shift occurs in the projection optical system 9. Therefore, after adjusting the imaging characteristics of the projection optical system 9, the reference mark and the alignment mark RM on the reticle R are again detected at the same time by the alignment sensor 16, to perform the second image shift measurement. Then, the misalignment amount of both marks is detected and stored as the measurement value 2 (step S5). The quantity of the exposure light in the case where the measurement in step S3 and step S5 is performed using the exposure light is not particularly limited, so long as the reference mark is arranged in the measurement position (so long as marks on the wafer applied with a resist are not detected).

In step S6, the image shift quantity attributable to the adjustment of the imaging characteristics including the lens magnification drive is calculated from a difference between the measurement value 2 obtained in step S5 and the measurement value 1 obtained in step S3 (measurement value 2 - measurement value 1). Then, of the error parameters determined by the above EGA measurement, X shift and Y shift are corrected using this calculated image shift quantity (step S7).

Thereafter, the corrected (re-corrected, with regard to the shift quantity) coordinate position is used to sequentially move the wafer stage 10 step by step, and the circuit pattern PT on the reticle R is sequentially exposed onto each shot area SS on the wafer W by the step and repeat method (step S8).

With the projection exposure method and the projection exposure apparatus in this embodiment, since the image shift quantity attributable to the lens magnification drive with respect to the projection optical system 9 is measured before the exposure processing, and is restored to the error parameters obtained by the EGA measurement, the positioning error of the wafer W attributable to the image shift can be eliminated. Therefore, in this embodiment, it becomes possible to expose a pattern onto a shot area where the circuit pattern is formed beforehand with predetermined accuracy, thereby enabling prevention beforehand of deterioration in overlapping accuracy. Moreover, in this embodiment, since the image shift quantity is measured during the actual exposure processing step, the evaluation result does not differ from the actual exposure, as in the case where the evaluation exposure is performed separately. As a result, the image shift quantity can be obtained accurately and quickly.

Furthermore, in this embodiment, since the misalignment amount between the reference mark and the alignment mark RM is measured via the projection optical system 9 in which image shift occurs, the image shift quantity can be detected more accurately. By determining the above misalignment amount via the alignment mark RM on the reticle R, the image shift quantity based on the reticle R can be detected, thereby enabling improvement in the alignment accuracy with respect to the reticle R.

Figure 4:
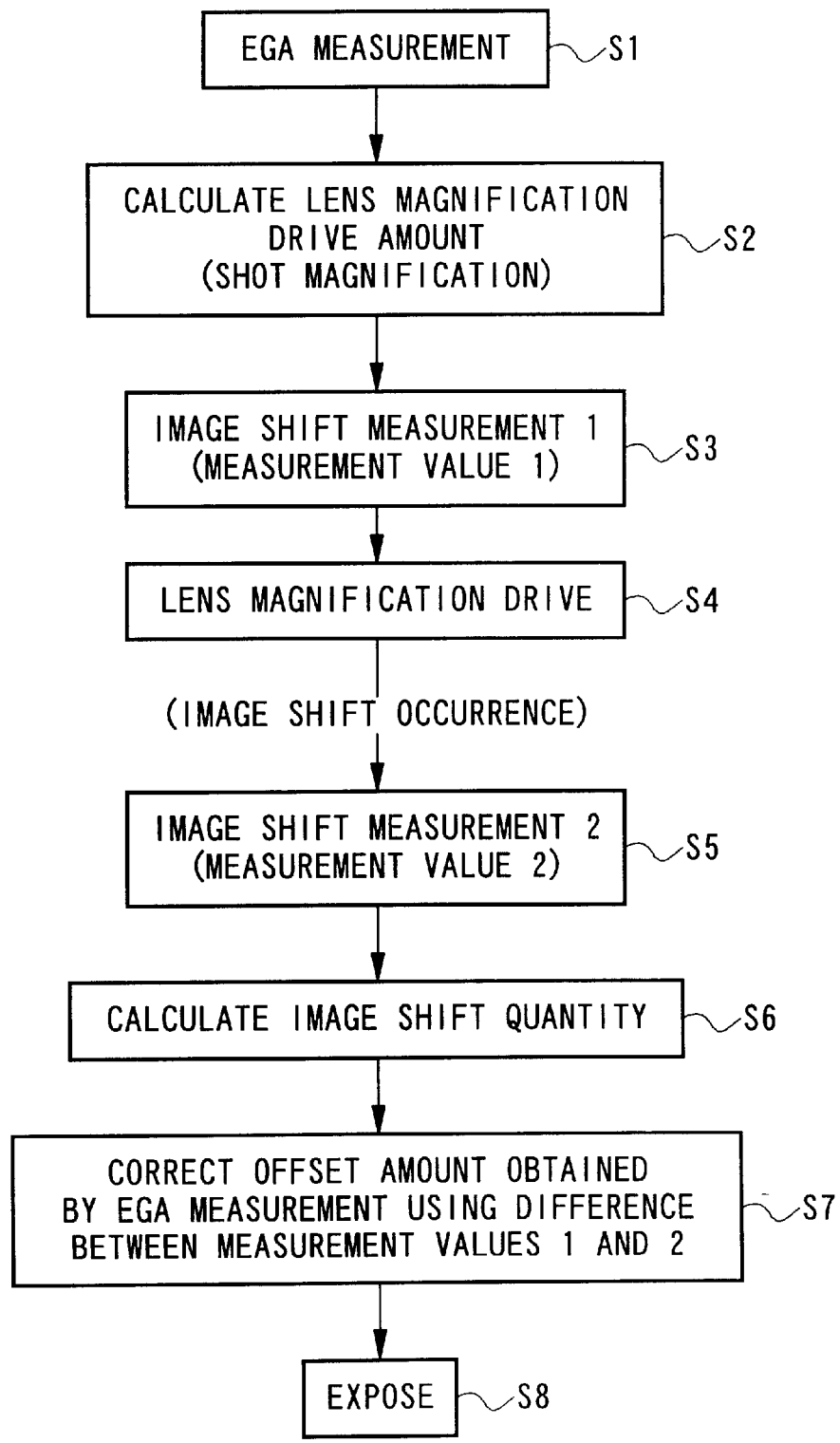
FIG. 4 is a flowchart showing the first embodiment of the present invention.
Figure 5:
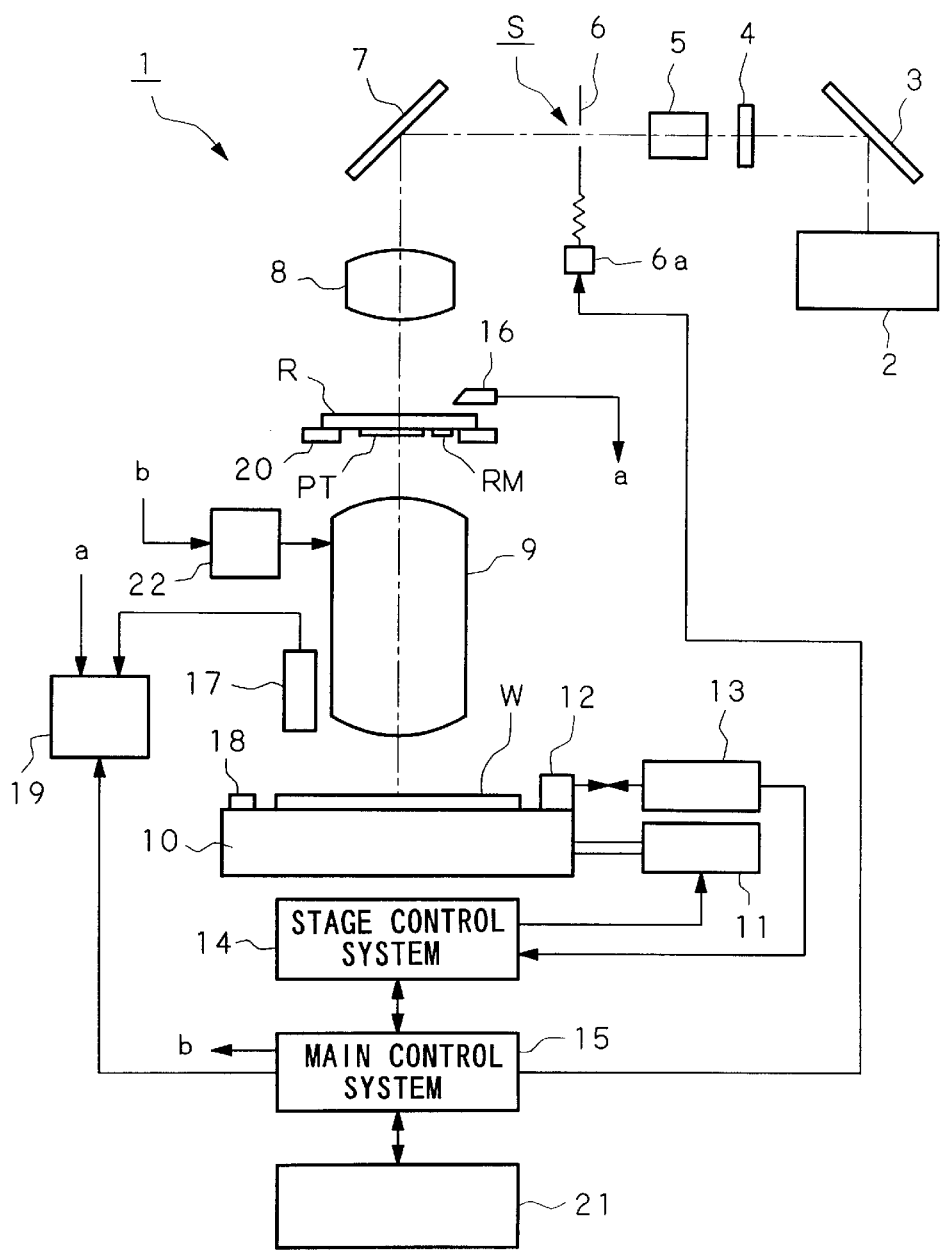
FIG. 5 is a diagram showing a second embodiment of the present invention, being a schematic block diagram of a projection exposure apparatus.

FIG. 5 is a diagram showing a second embodiment of the projection exposure method and the projection exposure apparatus of the present invention. In this FIG., the same components as those of the first embodiment shown in FIG. 1 to FIG. 4 are denoted by the same reference symbol, and description thereof is omitted. The different point between the second embodiment and the first embodiment is that there is arranged a wafer alignment sensor (measurement device) 17 of the off-axis method (second measurement method) for measuring the alignment mark WM on the wafer W without using the projection optical system 9.

As the alignment method of the wafer alignment sensor 17 of the off-axis method, the FIA method, the LSA method or the LIA method are applicable. In the LSA method or the LIA method, a photoelectric transducer such as a SPD or the like is used for the wafer alignment sensor 17, and in the FIA method, an imager such as CCD camera is used. Of these methods, the FIA method is adopted in this embodiment.

That is to say, the wafer alignment sensor 17 irradiates illumination light in a wavelength region that does not expose the resist on the wafer W, for example, broadband light having a wavelength of about from 550 to 750 nm, to the alignment mark WM on the wafer W, via an objective optical system provided separately from the projection optical system 9, forms an image of the alignment mark together with an image of an index mark on the photodetecting surface of an imager (CCD) through the objective optical system, and outputs an imaging signal (image signal) of the both mark images to the alignment control system 19. Moreover, the wafer alignment sensor 17 has an AF (auto focus) function, that is, a function of detecting position information of the wafer W related to the direction along the optical axis of the aforementioned objective optical system. By driving the wafer stage 10 based on the position information, it becomes possible to arrange the alignment mark on the wafer W on the focal plane of the aforementioned objective optical system.

The alignment control system 19 detects the misalignment amount of both marks based on the imaging signal from the wafer alignment sensor 17, and also inputs the measurement value of the laser interferometer 13, to thereby determine the position of the wafer stage 10 at which the misalignment amount of both marks becomes a predetermined value, for example, zero, as the coordinate value of the alignment mark on the wafer stage movement coordinate system XY, and outputs the position information to the main control system 15.

The main control system 15 gives an instruction related to the signal processing conditions to the alignment control system 19, and performs the EGA calculation based on the position information (coordinate value) of the alignment mark output from the alignment control system 19, and calculates the position information (coordinate value) of each shot area on the wafer W. Moreover, the main control system 15 corrects the calculated coordinate value, based on the baseline quantity, which is a distance between the center of the reticle R (or the projection optical system 9) and the wafer alignment sensor 17, and outputs this corrected coordinate value to the stage control system 14.

In order to perform second exposure with the projection optical system having the above construction, focus adjustment and search alignment are first performed with respect to the wafer W loaded on the wafer stage 10. Thereafter, the positions of the Y mark YEM and the X mark XEM on the wafer W are sequentially detected, using the wafer alignment sensor 17, to thereby perform the EGA measurement (step S1) shown in FIG. 4. Then, in accordance with the flowchart in FIG. 4, the image shift quantity is calculated, using the reticle alignment sensor 16, and after the offset quantity obtained by the EGA measurement is corrected, the circuit pattern is exposed onto the wafer W by the step and repeat method.

With the projection exposure method and the projection exposure apparatus in this embodiment, even in the case where the wafer alignment sensor 17 of the off-axis method is used, the image shift quantity attributable to the projection magnification adjustment of the projection optical system 9 is calculated using the reticle alignment sensor 16 of the TR method. As a result, similar effects to those of the above first embodiment can be obtained.

Figure 6:
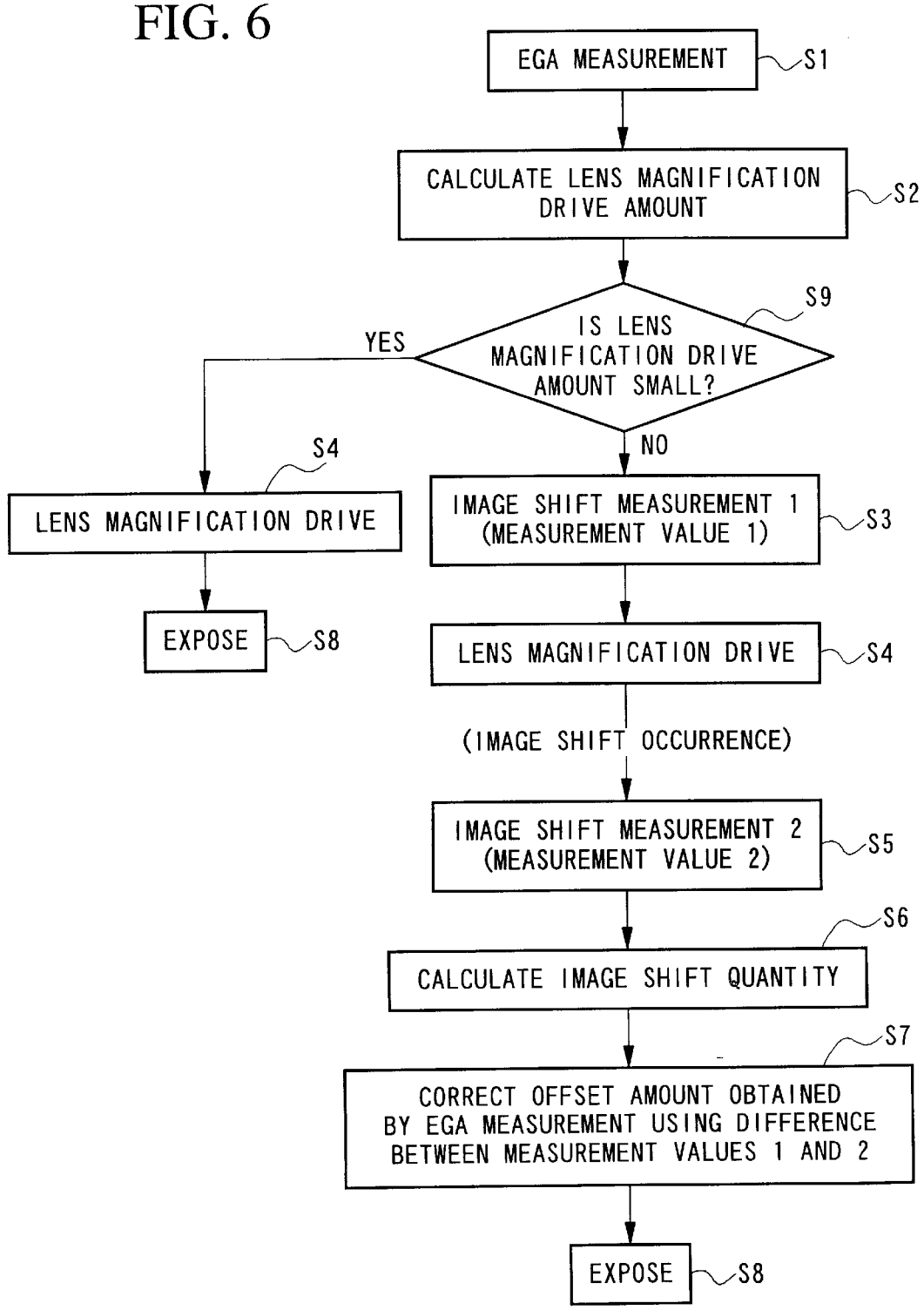
FIG. 6 is a flowchart showing a third embodiment of the present invention.

FIG. 6 is a flowchart showing a third embodiment of the projection exposure method and the projection exposure apparatus of the present invention. In this Figure, the same steps as those in the flowchart in the first embodiment shown in FIG. 4 are denoted by the same reference symbols, and description thereof is omitted. The different point between the third embodiment and the above first embodiment is that a step for judging whether a measurement of the image shift quantity is to be performed or not is provided.

That is to say, as shown in FIG. 6, in this embodiment, in step S1, the EGA measurement is performed by the reticle alignment system 16, and in step S2, the lens magnification drive amount is calculated. Thereafter, it is judged if this lens magnification drive amount is smaller than a tolerance (threshold) or not (step S9). This tolerance is set to a predetermined value at which the lens drive amount is small so that the image shift quantity can be ignored.

If the lens magnification drive amount is smaller than the tolerance; the imaging characteristics of the projection optical system 9 including the lens magnification drive are adjusted by the imaging characteristics adjusting system 22 (step S4), without performing the image shift measurement, and the wafer stage 10 is moved step by step based on the error parameters obtained by the EGA measurement, to thereby expose the circuit pattern PT sequentially onto each shot area SS on the wafer W (step S8).

On the other hand, if the lens magnification drive amount is larger than the tolerance in step S9, that is, the lens magnification drive is performed to a degree that the image shift quantity cannot be ignored, subsequently, the first image shift measurement (step S3), the lens magnification drive (step S4) and the second image shift measurement (step S5) are sequentially performed. After calculating the image shift quantity (step S6), the error parameters of the X shift and Y shift obtained by the EGA measurement are corrected using the calculated image shift quantity (step S7), to thereby execute the exposure processing (step S8).

With the projection exposure method and the projection exposure apparatus in this embodiment, if the lens drive amount is small and the image shift quantity pan be ignored, a the image shift measurement accompanied by driving of the wafer stage 10 is not performed. Therefore, the throughput accompanying the exposure processing can be improved. Also in this embodiment, the EGA measurement is not limited to the reticle alignment sensor of the TFR method, and the alignment sensor 17 of the off-axis method may be used.

Figure 7:
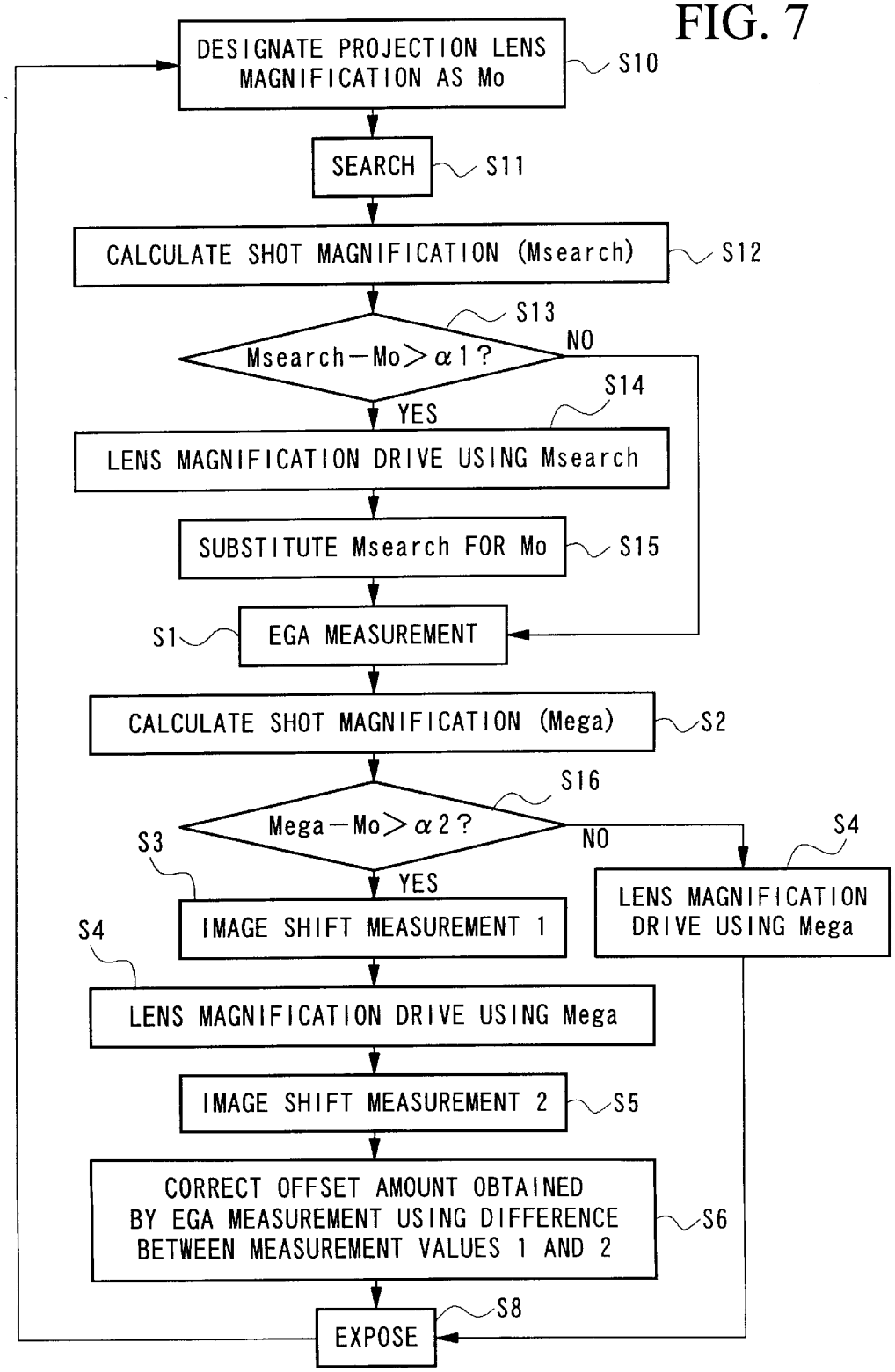
FIG. 7 is a flowchart showing a fourth embodiment of the present invention.

FIG. 7 is a flowchart showing a fourth embodiment of the projection exposure method and the projection exposure apparatus of the present invention. In this FIG., the same steps as those in the flowchart of the third embodiment shown in FIG. 6 are denoted by the same reference symbols, and description thereof is simplified. The different point between the fourth embodiment and the above third embodiment is that a step for judging whether the lens magnification drive is to be performed or not based on the search alignment result is provided.

A procedure to perform the second exposure will be described, using this flowchart. At first, the projection lens magnification set in the projection optical system 9 is designated as Mo (step S10). Then, the positions of the Y search mark YSM and the X search mark XSM are measured by the alignment sensor 16, to thereby perform search alignment (step S11). In the case where this measurement is performed with the exposure light, the quantity of light should be larger than the necessary minimum quantity for detecting the search mark, and should be a quantity of light which does not expose a resist applied on the wafer. Then, the shot magnification of the search shot (hereinafter, referred to as "Msearch") is calculated from the measurement result of each search mark obtained by the search alignment (step S12).

Here, it is judged if the difference between Msearch and Mo is larger than a tolerance al or not (step S13), and if it is not larger than the tolerance al, that is, the value of the projection magnification to be adjusted is not larger than the threshold, the EGA measurement is performed subsequently (step S1).

On the other hand, in step S13, if the difference between Msearch and Mo is larger than the tolerance α1, lens magnification drive is performed using Msearch (step S14). As a result, the projection magnification of the projection optical system 9 is set to the magnification obtained by the search alignment. The Msearch at this time is set as Mo (step S15). When execution of the lens magnification drive is completed using the result of the search alignment (or the lens magnification drive is not executed), the Y mark YEM and the X mark SEM of the EGA shots are sequentially measured by the alignment sensor 16, to thereby perform the EGA measurement (step S1), and the shot magnification at the time of performing exposure processing (hereinafter referred to as Mega) is calculated (step S2).

Then, it is judged if the difference between Mega and Mo is larger than a tolerance α2 or not (step S16), and if it is not larger than the tolerance α2, that is, the lens drive amount is small and the image shift quantity can be ignored, the imaging characteristics of the projection optical system 9 including the lens magnification drive are adjusted by the imaging characteristics adjusting system 22 (step S4), without performing the image shift measurement, and the wafer stage 10 is moved step by step based on the error parameters obtained by the EGA measurement, to thereby expose the circuit pattern PT sequentially onto each shot area SS on the wafer W (step S8).

Also, in step S16, if the difference between Mega and Mo is larger than the tolerance α2, that is, the lens magnification drive is performed to a degree that the image shift quantity cannot be ignored, subsequently, the first image shift measurement (step S3), the lens magnification drive (step S4) and the second image shift measurement (step S5) are sequentially performed. After calculating the image shift quantity (step S6), the error parameters of the X shift and Y shift obtained by the EGA measurement are corrected using the calculated image shift quantity (step S7), to thereby execute the exposure processing (step S8).

Then, the exposure processing in step S8 is terminated to take out the wafer W. When a new wafer is loaded on the wafer stage 10, the above described sequence is repeatedly executed.

With the projection exposure method and the projection exposure apparatus in this embodiment, in addition to obtaining the same effects as those in the above third embodiment, when the shot magnification is larger than the threshold, the lens magnification of the projection optical system 9 is driven, using the results obtained by performing the search alignment. Therefore, when the EGA measurement is performed, the projection magnification is adjusted approximately to the projection magnification at the time of performing the exposure processing. Hence, the EGA measurement can be performed in a state closer to the actual exposure light to obtain the error parameters, thereby enabling improvement in the overlapping accuracy. Moreover, this search alignment is always performed before the EGA measurement, regardless of the existence of the image shift measurement, and a separate measurement step is not provided as with the image shift measurement. Hence, the overlapping accuracy can be improved without causing a decrease in the throughput.

Moreover, in this embodiment, since the EGA measurement is performed after having adjusted the magnification of the projection optical system 9 based on the result of the search alignment, even if an error occurs in the projection magnification adjustment, as in the case where a search mark different from a mark to be searched is measured at the time of search alignment, the error can be promptly detected, thereby enabling prevention of the occurrence of poor exposure beforehand. Furthermore, in this embodiment, the image shift measurement is performed before and after the re-adjustment of the projection magnification based on the result of the EGA measurement. Hence, even if an image shift occurs resulting from the re-adjustment, the error parameters can be reliably corrected to thereby maintain the overlapping accuracy.

In this embodiment, the lens magnification drive based on the search alignment results and the image shift measurement based on the EGA measurement results are not always performed, and are performed only in a predetermined case, by comparing the results thereof with the tolerance, respectively in steps S13 and S16. Hence, unnecessary sequences are not performed, thereby enabling improvement in the throughput accompanying the exposure processing. Particularly, in this embodiment, in many cases, error parameters of such a degree that execution of the image shift measurement is not necessary can be obtained by the EGA measurement. Hence, execution of the image shift measurement accompanied by driving of the wafer stage 10 is hardly necessary, thereby enabling further improvement in the throughput accompanying the exposure processing.

The above fourth embodiment may have a construction such that if the alignment sensor 16 of the TTR method is used for the image shift measurement in step S3 and step S5, then, the alignment sensor 17 of the off-axis method shown in FIG. 5 may be used for the search alignment and the EGA measurement.

In the above respective embodiments, the construction is such that the alignment sensor performing the image shift measurement measures the reference mark on the wafer W via the reticle R. However, the construction is not limited thereto, and measurement need not be performed via the reticle R, so long as the measurement method performs measurement via the projection optical system 9, that is, a so-called TTL (through the lens) method is used.

Moreover, in the above respective embodiments, the construction is such that the reference mark on the reference mark member 18 is measured as a mark on the wafer stage 10, at the time of measuring the image shift. However, the mark is not limited thereto, so long as it is a mark serving as a reference, and even if the alignment mark WM, such as the search marks YSM, XSM formed on the wafer W, or the marks YEM, XEM for the EGA measurement is measured, a similar action and effects can be obtained. In this case, since the alignment mark WM is in a position closer to the detection position of the alignment sensor of the TTR method than the reference mark, the moving distance of the wafer stage 10 becomes short, thereby enabling further improvement in the throughput.

In the above respective embodiments, shift of the optical axis of the projection optical system (image shift) resulting from the adjustment of the imaging characteristics of the projection optical system 9 is determined by measuring the mark before and after the adjustment of the imaging characteristics (that is, by measuring the mark at least twice).

However, if evaluation exposure (experiment) or simulation is performed under various environmental conditions (temperature, humidity, atmospheric pressure, etc.), taking the hysteresis of the above described lens drive magnification into account, to thereby determine information indicating "the relation between the imaging characteristics adjusted amount and the image shift quantity" beforehand for each condition (for each subdivided condition), it is possible to correct the EGA error parameters based on the relation information. A fifth embodiment in which the image shift measurement is not performed will now be described. According to this fifth embodiment, since time for measuring the mark in order to determine the image shift after the adjustment of the imaging characteristics can be saved, it becomes possible to improve the throughput of the apparatus.

In order to realize the fifth embodiment, for example, the above described relation information may be stored in the memory 21 shown in FIG. 1. If a large capacity memory is necessary for storing the information quantity of this relation information, however, a memory (not shown) dedicated to storing the above relation information may be provided in the exposure apparatus, separately from this memory 21. Alternatively, the construction may be such that this dedicated memory is provided outside of the exposure apparatus, and this external memory (not shown) and the exposure apparatus communicate with each other via a host computer (not shown) for integratedly controlling a plurality of exposure apparatus, or a network. By having such construction, th e exposure apparatus side (the main control system 15 of the exposure apparatus 1) can communicate with the external memory only at necessary times, to thereby obtain the above described relation information.

As the form of the relation information, "the relation between the imaging characteristics adjusted amount, the image shift quantity and the environmental conditions" may be held in the form of a table, or the information may be held in the form of a relational expression of the both (the imaging characteristics adjusted amount and the image shift quantity) for each environmental condition, or other various forms can be considered.

Also, in the fifth embodiment, environment sensors (such as a temperature sensor, a humidity sensor and an atmospheric pressure sensor) (not shown) are installed in the vicinity of the projection optical system 9 and/or inside of the projection optical system 9, so that the detection results of these environment sensors can be transmitted to the main control system 15.

The operation of the fifth embodiment will now be described. Here, the operation of the fifth embodiment will be described, using FIG. 4, with only the points changed from the operation in the above described first embodiment being described.

At first, similarly to FIG. 4, the operations in step S1 and step S2 are performed.

Then, the operation in step S3 is skipped (not executed), and the imaging characteristics adjusting operation in step S4 is performed. At the time of the operation in step S4, the output values of the above described environment sensors are monitored. The monitoring timing of the environment sensors may be at least once during adjustment of the imaging characteristics, or may be several times during adjustment of the imaging characteristics. Alternatively, monitoring of the environment sensors may be performed before and after the adjustment of the imaging characteristics (in this case, the average value of the output value monitored before and after the adjustment may be used, or if the change in the environment before and after the adjustment is large, only the output value after the adjustment may be used).

Next, the operation in step S5 is skipped (not executed), and calculation of the image shift quantity in step S6 is performed. Here, the optimum image shift quantity is determined, based on the output of the above described environment sensors and the imaging characteristics adjusted amount performed in step S4, using the information (relation information) indicating "the relation between the imaging characteristics adjusted amount and the image shift quantity" stored in the above described memory for each condition (environmental condition). As one example, when the above relation information is stored in the form of a table, the optimum image shift quantity is extracted based on the output values of the environment sensors and the imaging characteristics adjusted amount. Also, as one example, when the above relation information is stored in the form of a relational expression, the output values of the environment sensors and the imaging characteristics adjusted amount are input to the relational expression, to calculate the optimum image shift quantity.

Then in step S7, based on the image shift quantity obtained in step S6, the error parameters (X shift and Y shift) are corrected.

The operation hereafter is to sequentially move the wafer stage 10 step by step, using the corrected coordinate position, as in the above described respective embodiments, to thereby sequentially expose the circuit pattern PT on the reticle R onto each shot area SS on the wafer W by the step and repeat method.

The above is the operation of the fifth embodiment.

The imaging characteristics of the projection optical system 9 change due to not only the above described environmental conditions, but also various exposure conditions (for example, a change in the quantity of the illumination light for exposure shone into the projection optical system, or a change in the illumination conditions of the illumination light for the exposure). Therefore, "the relation between the imaging characteristics adjusted amount and the image shift quantity" including also these various exposure conditions may be stored in the above described memory.

For example, with regard to the change in the illumination light for exposure, an optical member (not shown) for diverging the illumination light is arranged at any position between the reticle R and the light source 2, and a light quantity sensor (not shown) for photoelectrically detecting the diverged illumination light is set up. Such a light quantity sensor itself involves known technology. By monitoring the output of the light quantity sensor, a change in the quantity of the illumination light is detected, and the detection result is transmitted to the main control system 15. The relation information indicating "the relation between the imaging characteristics adjusted amount and the image shift quantity and the quantity of illumination light" is stored beforehand in the memory. The main control system 15 then determines the optimum image shift quantity, based on the output value of the light quantity sensor and the imaging characteristics adjusted amount determined in step S4. At the time of determination of this image shift quantity, the above described environmental conditions may be used as one parameter for determining the optimum image shift quantity (in this case, the above relation information is determined beforehand as the relation information indicating "the relation between the imaging characteristics adjusted amount, the image shift quantity, the environmental conditions and the quantity of illumination light").

On the other hand, the illumination conditions include so-called normal illumination conditions wherein the distribution of the quantity of light on the pupil plane of the illumination system includes the illumination optical axis, and so-called variation illumination conditions wherein the distribution of the quantity of light on the pupil plane of the illumination system is increased outside of the illumination optical axis, rather than in the vicinity thereof. Moreover, the variation illumination conditions include a cycle illumination condition wherein the distribution of the quantity of light on the pupil plane of the illumination system becomes a form of a cycle, and a local illumination light condition wherein the distribution of the quantity of light on the pupil plane of the illumination system is increased in a plurality of local areas eccentric from the illumination optical axis. A changeover mechanism for changing over these illumination conditions to an optional illumination condition, and a detection mechanism for detecting the change in the illumination conditions by this changeover mechanism are incorporated in the exposure apparatus. These changeover mechanism and detection mechanism involve known technology. The apparatus is constructed such that by monitoring the output of the detection mechanism, the set illumination conditions are detected, and the detection results are transmitted to the main control system 15. Then, the relation information indicating "the relation between the imaging characteristics adjusted amount, the image shift quantity and the illumination conditions" is determined beforehand and stored in the memory. The main control system 15 then determines the optimum image shift quantity, based on the output value of the detection mechanism and the imaging characteristics adjusted amount determined in step S4. At the time of determination of this image shift quantity, the above described environmental conditions and the quantity of the illumination light may be used as one parameter for determining the optimum image shift quantity (in this case, the above relation information is determined beforehand as the relation information indicating "the relation between the imaging characteristics adjusted amount, the image shift quantity, the illumination conditions, the environmental conditions and the quantity of illumination light").

In the fifth embodiment, the construction may be such that the optimum image shift quantity is calculated with respect to various conditions at the time of adjusting the imaging characteristics, by using a known interpolation method (interpolation operation), without storing all the above relation information for each of the various conditions (the above described environmental conditions, exposure conditions, and the like). That is to say, the interpolation operation may be performed, using the above relation information stored in the memory.

In many cases, what largely drives the imaging characteristics (for example, lens magnification) of the projection optical system 9 is the head of the lot. Therefore, the image shift measurement and image shift calculation (extraction) described in the above described respective embodiments may be performed only for the head of the lot or in the case where the exposure accuracy determined with respect to the wafer W is high, these may be performed for each wafer.

In the above described respective embodiments, the shot magnification drive amount is calculated (step S2) from the EGA measurement result (step S1), and the imaging characteristics of the projection optical system 9 are adjusted based on the calculated shot magnification drive amount. In each embodiment, the image shift quantity resulting from the adjustment of the imaging characteristics is determined.

However, the present invention is not limited thereto. For example, there is a case where the imaging characteristics of the projection optical system 9 are adjusted in order to correct distortion of the projection optical system 9 or other various aberrations (comatic aberration). In the case where the imaging characteristics of the projection optical system are adjusted for correcting such aberration or distortion, the above described image shift quantity is generated. The image shift quantity in this case can be determined by using a measurement technique described in the above described respective embodiments (that is, a mark is measured before and after adjustment of the imaging characteristics and based on the measurement results, the image shift quantity is determined), or by using a calculation and extraction method based on the above described relation information stored in the memory.

In the above described respective embodiments, error parameters determined by the EGA measurement (specifically, the offset parameter) are corrected using the determined image shift quantity, but the present invention is not limited thereto. Various information related to alignment (for example, the calculated position for each shot calculated by performing the EGA operation, or the baseline quantity of the off-axis alignment sensor) may be corrected using this determined image shift quantity.

Two or more sets of Y mark and X mark for the EGA measurement in each shot area may be provided, or two or more sets of two-dimensional XY marks for measuring the position information in the X direction and the Y direction may be provided (so-called multipoint measurement within shot). In this case, by measuring these marks, the position information of each shot area can be obtained. Specifically, it becomes possible to calculate four error parameters, that is, X scale, Y scale, rotation and perpendicularity in each shot area, by detecting at least three sets of X mark and Y mark (in the case of the two dimensional mark, at least three sets of XY marks) in each EGA shot to obtain the position information. Thereby, ten error parameters, in combination with six error parameters related to the array characteristics of the shot area (related to the wafer), can be obtained, and hence overlap of each shot area can be performed more accurately. Moreover, it is not always necessary to calculate all the four error parameters in the shot area, and the number of the error parameters may be any of from one to three. For example, three error parameters, that is, X scale, Y scale and rotation in the shot area may be calculated, by detecting two sets of X mark and Y mark (in the case of the two-dimensional mark, two sets of XY marks) in each EGA shot to obtain the position information. The X scale and Y scale are magnification errors in the shot area, related to the X direction and the Y direction, respectively.

As the substrate in this embodiment, not only the semiconductor wafer W for manufacturing the semiconductor devices, but also a glass plate for display devices, a ceramic wafer for thin-film magnetic heads, an original plate (synthetic quartz, silicon wafer) of a mask or a reticle used in the exposure apparatus or the like can be applied.

For the projection exposure apparatus 1, the invention is not only applicable to projection exposure apparatus of the step and repeat method (stepper) wherein a pattern of a reticle R is exposed with the reticle R and the wafer W stationary and the wafer W is sequentially moved step by step, but this is also applicable to the scanning type exposure apparatus of the step and scan method (scanning stepper: U.S. Pat. No. 5,473,410) wherein a pattern of a reticle R is scanned and exposed by synchronously moving the reticle R and the wafer W. The present invention is also applicable to exposure apparatus of the step and stitch method wherein at least two patterns are partially overlapped and transferred onto the wafer W.

For the kind of the exposure apparatus 1, the invention is not only applicable to exposure apparatus for manufacturing semiconductor devices, but this can also be widely applied to exposure apparatus for manufacturing thin-film magnetic heads, imagers (CCD) or reticles or masks.

As the light source 2, not only can an emission line generated from an extra-high pressure mercury lamp (g-rays (436 nm), h-rays (404. nm), I-rays (365 nm)), a KrF excimer laser (248 nm), an ArF excimer laser (193 nm), an F2 laser (157 nm) or an Ar2 laser (126 nm) be used, but also charged particle beams such as electron beams and ion beams may be used. For example, when electron beams are used, a thermionic emission type lanthanum hexaborite (LaB6) and tantalum (Ta) can be used as an electron gun. The higher harmonics such as from a YAG laser or a semiconductor laser may be also used.

For example, a single-frequency laser in the infrared region or in the visible range emitted from a DFB semiconductor laser or a fiber laser may be amplified with a fiber amplifier doped with erbium (or both of erbium and yttoribium), and high harmonics whose wavelength is converted to ultraviolet light by using nonlinear optical crystals may be used as the exposure light. If it is assumed that the emission wavelength of the single-wavelength laser is in the range of from 1.544 to 1.553 $\mu$m, ultraviolet light having eightfold harmonics in the range of from 193 to 194 nm, that is, having substantially the same wavelength as that of the ArF excimer laser can be obtained. If it is assumed that the emission wavelength is in the range of from 1.57 to 1.58 $\mu$m, ultraviolet light having tenfold harmonics in the range of from 157 to 158 nm, that is, having substantially the same wavelength as that of the F2 laser can be obtained.

Moreover, the soft X-ray region having a wavelength of about 5 to 50 nm emitted from a laser plasma light source or an SOR, for example, EUV (Extreme Ultra Violet) light having a wavelength of 13.4 nm or 11.5 nm may be used as the exposure light. With the EUV exposure apparatus, a reflective type reticle is used, and the projection optical system is a reduction system comprising only a plurality of (for example, 3 to 6) reflective optical elements (mirrors). Furthermore, hard X-rays (for example, having a wavelength of 1 nm or below) may be used as the exposure light, and with this exposure apparatus, the proximity method is adopted.

The projection optical system 9 may be not only a reduction system but may be also either of an equal magnification or enlarging system. Moreover, the projection optical system 9 may be either of a refraction system, a reflection system or a reflection/refraction system. When the wavelength of the exposure light is not larger than about 200 nm, it is desirable to purge the optical path through which the exposure light passes with a gas having less absorption of the exposure light (an inert gas such as nitrogen or helium). When electron beams are used, an electron optical system comprising an electron lens and a deflector may be used as the optical system. Needless to say, the optical path through which the exposure light passes should be in a vacuum condition.

When a linear motor is used for the wafer stage 10 or the reticle stage 20 (see U.S. Pat. No. 5,623,853 or U.S. Pat. No. 5,528,118), either of an air floating type using an air bearing or a magnetic floating type using a Lorentz force or reactance force may be used. Each stage 10 and 20 may also be a type which moves along a guide, or a guideless type without a guide.

As the drive mechanism for the respective stages 10 and 20, a planar motor may be used wherein a magnetic unit in which magnets are arranged two-dimensionally and an armature unit in which coils are arranged two-dimensionally are made to face each other, and the respective stages 10 and 20 are driven by an electromagnetic force. In this case, either the magnetic unit or the armature unit is connected to the stages 10 and 20, and the other of the magnetic unit or the armature unit may be provided on the moving plane side of the stages 10 and 20.

The reaction force generated by the movement of the wafer stage 10 may be removed mechanically to the floor (ground) using a frame member, so as not to be transmitted to the projection optical system 9, as described in Japanese Unexamined Patent Application, First Publication No. Hei 8-166475 (U.S. Pat. No. 5,528,118).

The reaction force generated by the movement of the reticle stage 20 may be removed mechanically to the floor (ground) using a frame member, so as not to be transmitted to the projection optical system 9, as described in Japanese Unexamined Patent Application, First Publication No. Hei 8-330224 (U.S. Pat. Ser. No. 08/416,558).

As described above, the projection exposure apparatus 1 of the embodiments of this application is manufactured by assembling various sub-systems including respective constituents mentioned in the claims of this application, so as to maintain a predetermined mechanical precision, electrical precision and optical precision. To ensure these various precisions, there are performed adjustments for obtaining the optical, precision with respect to various optical systems, adjustments for obtaining the mechanical precision with respect to various mechanical systems, and adjustments for obtaining the electrical precision with respect to various electrical systems, prior to assembly. The assembly steps from the various sub-systems to the exposure apparatus includes mechanical connection, wiring connection of electrical circuits and piping connection of pneumatic circuits between the various sub-systems. Prior to the assembly steps from the various sub-systems to the exposure apparatus, there is, of course, an assembly step for each sub-system. After the assembly steps from the various sub-systems to the exposure apparatus have been completed, comprehensive adjustment is performed to thereby ensure various precisions for the overall exposure apparatus. In addition, it is desirable that the production of the exposure apparatus be performed in a clean room wherein the temperature, the degree of cleanness and the like are controlled.

Figure 8:
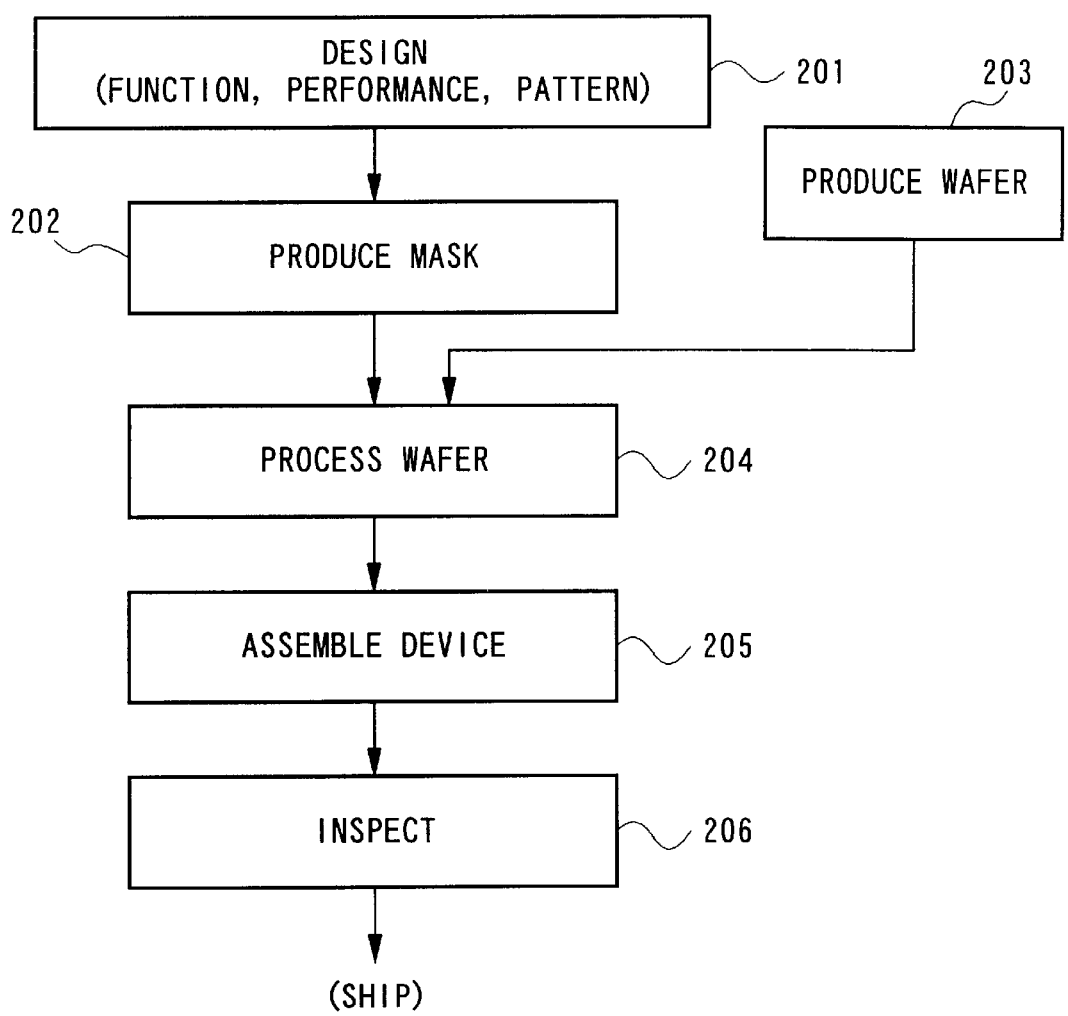
FIG. 8 is a flowchart showing one example of a manufacturing process of semiconductor devices.
Figure 9:
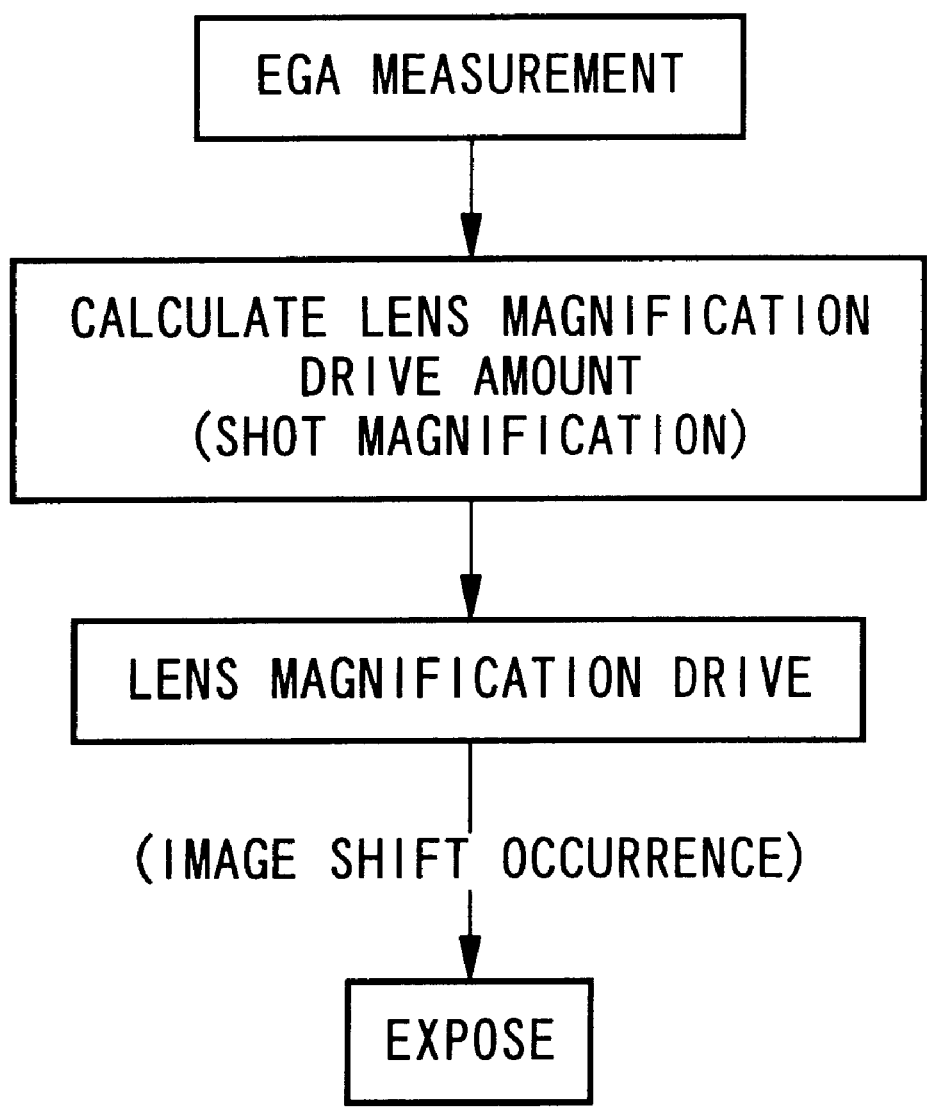
FIG. 9 is a flowchart showing one example of a conventional projection exposure method.

Semiconductor devices are manufactured, as shown in FIG. 8, through steps such as: a step 201 for designing the function and performance of the device; a step 202 for producing masks (reticles) based on the designing step; a step 203 for producing wafers from a silicon material; a wafer processing step 204 for exposing a pattern of a reticle to a wafer by means of the exposure apparatus 1 in the above described embodiments; a device assembly step (including a dicing step, a bonding step and a packaging step) 205; and an inspection step 206.

What is claimed is:

1. A projection exposure method in which after imaging characteristics of a projection optical system are adjusted based on measurement results of marks formed on a substrate mounted on a substrate stage, said substrate is exposed by a predetermined pattern via said projection optical system, comprising the steps of:
    determining information related to an imaging position of said projection optical system after adjustment of said imaging characteristics and before exposure of said substrate; and
    calculating information regarding an error parameter related to an array characteristic of a plurality of shot areas on the substrate based on said measurement results of marks and said determined information related to the imaging position.

2. A projection exposure method according to claim 1, wherein
    said imaging characteristics include projection magnification of said projection optical system, and
    information related to the imaging position of said projection optical system is obtained by measuring information related to the imaging position of the projection optical system after adjustment of said imaging characteristics and before exposure of said substrate.

3. A projection exposure method according to claim 2, wherein
    information related to said imaging position is measured by measuring position information of a mark on said substrate stage via said projection optical system.

4. A projection exposure method according to claim 3, wherein
    said mark on said substrate stage includes either one of a reference mark set on said substrate stage or a mark on said substrate mounted on said substrate stage.

5. A projection exposure method according to claim 3, wherein
    information related to said imaging position is measured by measuring position information of said mark on said substrate stage via a mask having said predetermined pattern formed thereon.

6. A projection exposure method according to claim 5, wherein
    a mask mark is formed on said mask, and
    information related to said imaging position is measured by measuring a relative position of said mask mark and a mark on said substrate stage.

7. A projection exposure method according to claim 2, wherein
    adjustment of projection magnification of said projection optical system is performed based on the measurement result obtained by measuring the position information of the mark formed on said substrate with predetermined measurement accuracy.

8. A projection exposure method according to claim 7, further comprising the steps of:
    measuring position information of a plurality of marks formed on said substrate at a higher measurement accuracy than said predetermined measurement accuracy after adjusting said projection magnification based on the measurement results at said predetermined measurement accuracy, and
    calculating position information of a plurality of shot areas on said substrate based on the measurement results of said plurality of marks with higher measurement accuracy than said predetermined measurement accuracy.

9. A projection exposure method according to claim 8, further comprising the steps of:
    performing readjustment of the projection magnification of said projection optical system based on the measurement results of said plurality of marks with higher measurement accuracy than said predetermined measurement accuracy,
    respectively performing measurement of information related to said imaging position before and after readjustment of said projection magnification, and
    correcting said calculated position information of a plurality of shot areas on said substrate based on the information related to the imaging position respectively measured before and after readjustment of said projection magnification.

10. A projection exposure method according to claim 9, further comprising the step of:
    determining whether measurement of information related to said imaging position is to be performed or not, depending on the readjustment amount of said projection magnification calculated based on the measurement results of said plurality of marks with higher measurement accuracy than said predetermined measurement accuracy.

11. A projection exposure method according to claim 2, further comprising the steps of:

calculating position information of a plurality of shot areas on said substrate and the adjusted amount of said projection magnification, by measuring position information of a plurality of marks formed on said substrate and performing statistical processing using results of said measurement, performing adjustment of said projection magnification based on an adjustment amount of said computed projection magnification, respectively measuring information related to said imaging position before and after adjustment of said projection magnification, and correcting said calculated position information of the plurality of shot areas on the substrate based on the information related to said imaging position respectively measured before and after the adjustment of said projection magnification.

12. A projection exposure method according to claim 11, further comprising the step of:

determining whether measurement of information related to said imaging position is to be performed or not, depending on the adjusted amount of said projection magnification calculated by said statistical processing.

13. A projection exposure method according to claim 11, wherein said position information of a plurality of marks is measured with or without said projection optical system.

14. A device manufacturing method comprising a step of:

transferring a device pattern formed on a mask onto a substrate, using the projection exposure method according to claim 1.

15. A projection exposure apparatus for projection-exposing a predetermined pattern formed on a mask onto a substrate mounted on a substrate stage via a projection optical system, comprising:

a measurement device which measures position information of a plurality of marks formed on said substrate;

an adjustment device, which is electrically connected to said measurement device, and which adjusts an imaging characteristic of said projection optical system based on the results of measurement by said measurement device;

a detection device, which is electrically connected to said adjustment device, and which obtains information related to a change of an imaging position of said projection optical system attributable to adjustment of said imaging characteristic by said adjustment device; and a calculation device, which is electrically connected to said measurement device and said detection device, and which calculates information regarding error parameter related to an array characteristic of a plurality of shot areas on the substrate based on said position information of the plurality of marks and said obtained information related to the change of the imaging position.

16. A projection exposure apparatus according to claim 15, wherein said imaging characteristics include projection magnification of said projection optical system, and said detection device respectively detects the information related to said imaging position of said projection optical system before and after adjustment by said adjustment device.

17. A projection exposure apparatus according to claim 16, wherein said detection device measures the position information of a reference mark placed on said stage, or a mark on said substrate, via said projection optical system.

18. A projection exposure apparatus according to claim 16, wherein said calculation device comprises:

a first portion which performs statistical processing using the results of measurement by said measurement device, and calculating the position information of a plurality of shot areas on said substrate and the adjusted amount by said adjustment device, and a second portion which corrects the position information of said plurality of shot areas calculated by said first portion, based on information related to said imaging position detected by said detection device.

19. A projection exposure apparatus according to claim 16, wherein said measurement device measures the position information of said marks by either one of a first measuring method for measuring said position information via said projection optical system, and a second measuring method for measuring said position information without using said projection optical system.

* * * * *